June 7, 1966 R. J. ANDRES ETAL 3,254,389
METHOD OF MAKING A CERAMIC SUPPORTED SEMICONDUCTOR DEVICE
Filed Dec. 5, 1961 2 Sheets-Sheet 1
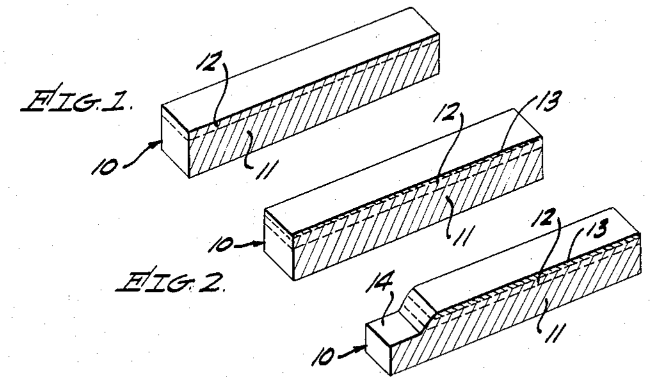
FIG. 1, FIG. 2
FIG. 3
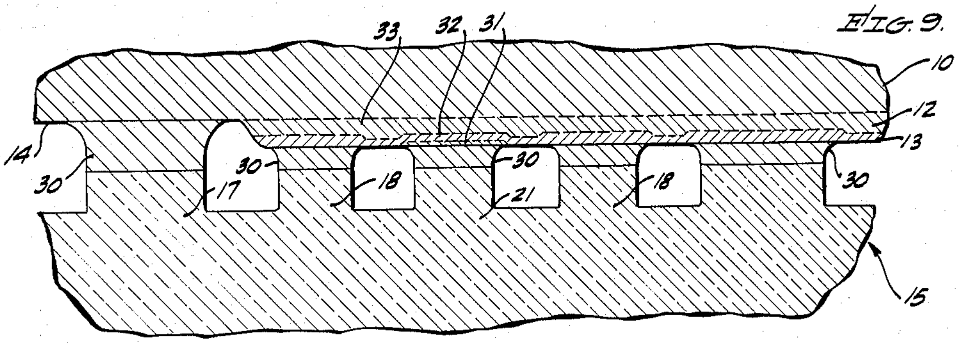
FIG. 9
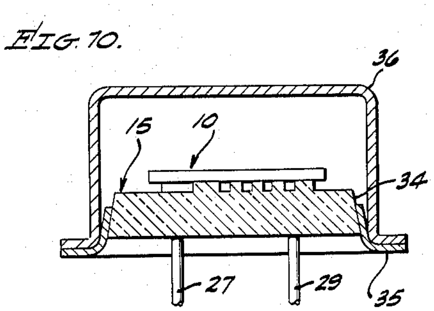
FIG. 10
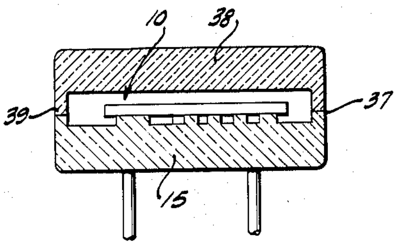
FIG. 11
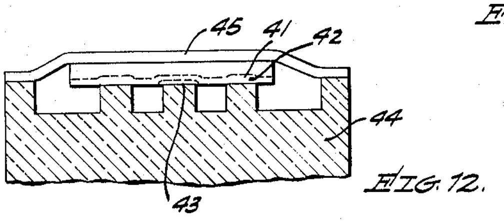
FIG. 12
INVENTOR.
RAYMOND J. ANDRES,
PETER V.N. HELLER,
BY
Charles S. Haughey
ATTORNEY.

METHOD OF MAKING A CERAMIC SUPPORTED SEMICONDUCTOR DEVICE
Filed Dec. 5, 1961 2 Sheets-Sheet 2
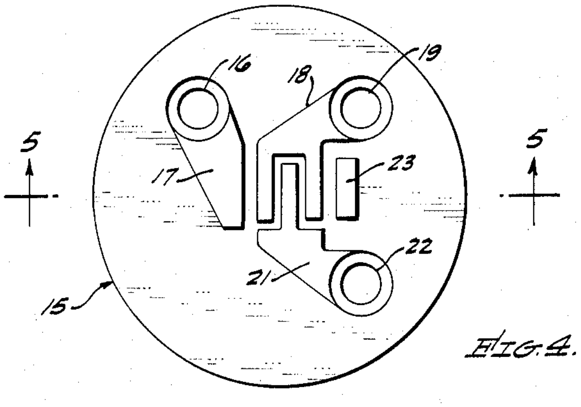
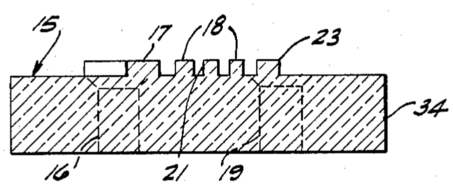
FIG. 5.
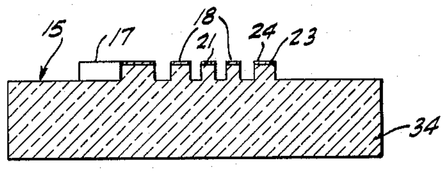
FIG. 6
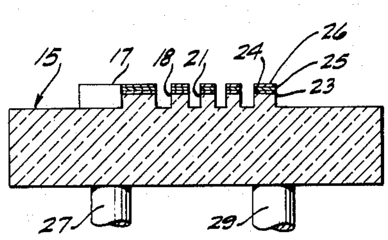
FIG. 7.
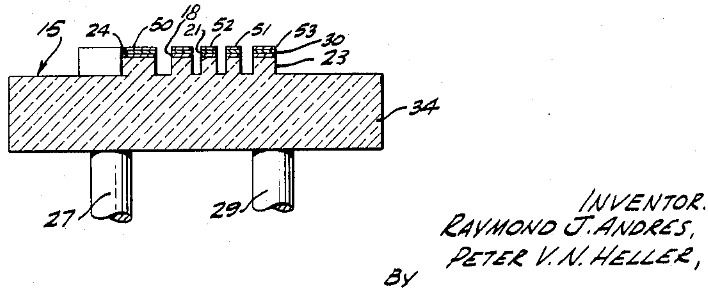
FIG. 8.
INVENTOR.
RAYMOND J. ANDRES,
PETER V. N. HELLER,
BY
Charles S. Haughey
ATTORNEY.

United States Patent Office 3,254,389

Patented June 7, 1966

3,254,389

METHOD OF MAKING A CERAMIC SUPPORTED SEMICONDUCTOR DEVICE

Raymond J. Andres, Newport Beach, and Peter V. N. Heller, Dana Point, Calif., assignors to Hughes Aircraft Company, Culver City, Calif., a corporation of Delaware Filed Dec. 5, 1961, Ser. No. 157,075
14 Claims. (Cl. 29—25.3)

This invention relates to the manufacture of ceramic supported semiconductor devices, and more particularly to semiconductor device manufacture wherein contacts and PN junctions are made in a single bonding operation by contacting a semiconductor crystal with and bonding it to a preformed, nonconductive refractory element having metal coated areas which may be of or contain opposite or different electrical conductivity type doping materials.

The manufacture of high quality semiconductor devices, and particularly of transistors, customarily requires a great many manufacturing steps or operation in the formation of junctions, making lead contacts, etching, cleaning and washing after nearly every step, and encapsulation.

By properly preparing an electrically nonconductive refractory element, doping materials, electrically conductive paths, and even external leads may be prepared without the semiconductor crystal present. Many hazards to the final product, as well as many operations and associated cleaning steps required to obtain final device quality, may be avoided by the use of such nonconductive elements in manufacture of semiconductor devices. Devices so produced may have highly desirable characteristics such as low-inductance leads, hence high frequency capability, uniformity and compactness. One heating step may be used in a combined bonding, crystal PN junction and contact formation step, and in some cases encapsulation may be accomplished in the same heating step.

The preferred electrically nonconductive, refractory material for practice of this invention in the production of germanium crystal semiconductor devices is alumina $Al_2O_3$. It may be initially cut from the green, or bisque, state and subsequently fired to cure, or set the alumina. The thermal expansion characteristics of cured alumina and germanium crystal materials match sufficiently to produce very stable devices. Other nonconductive refractory materials, such as berillia, $Be_2O_3$, high temperature glasses and other refractory materials capable of withstanding the necessary fabrication temperatures may be used. For purposes of this specification, such electrically nonconductive, refractory materials shall be called ceramics, or ceramic materials.

In the practice of this invention a ceramic element is prepared with an electrically conductive area which contains a bonding alloy and a conductivity-type dopant, and a device is produced by heating the element in contact with a semiconductor crystal to bond said area thereto and to form a PN junction by the addition of the dopant to a region of the crystal to change the conductivity type of the region. The conductive area is preferably a metal-coated mesa, or raised portion to be hereinafter described. The dopant may itself be a bonding alloy which will electrically and mechanically connect the crystal to the ceramic element.

For further consideration of what is believed to be novel and inventive, attention is drawn to the following portion of the specification, the appended claims, and the drawings wherein:

FIGS. 1, 2 and 3 illustrate steps in preparation of a semiconductor crystal die for transistor manufacture;

FIGS. 4 through 8 illustrate steps in preparation of a metal coated ceramic element for transistor manufacture;

FIG. 9 is a sectional view of active portions of a transistor produced upon assembly of the elements of FIGS. 1–3 and 4–8;

FIG. 10 is a sectional view of a transistor in a standard metal package;

FIG. 11 is a sectional view of a transistor in a special ceramic package; and

FIG. 12 is a sectional view of active portions of an alternate transistor structure.

The making of a semiconductor device according to this invention as illustrated in the drawing comprises first, preparing a semiconductor die or bar of device quality, preferably having high bulk crystal conductivity and an epitaxially formed low conductivity layer on one face thereof of about 10 to 15 microns thickness; second, preparing a ceramic support element having a surface pattern of areas of electrically conducting, bonding and doping materials, generally raised for ease of fabrication, preferably with leads bonded to the element in electric connection with at least two such surface areas; and third, assembling and heat treating the die, with the epitaxial layer, if any, in contact with said surface areas of the support element, to form the necessary ohmic contacts and NP junctions and the desired device configuration. The assembly may then be encapsulated in a standard metal package, or it may be encapsulated in a special ceramic package formed by covering the support element with a suitably matching ceramic cap.

The making of a PNP type germanium transistor is illustrated in the drawings. In FIGS. 1 through 3 the stepwise preparation of the crystal die is illustrated. FIG. 1 shows a crystals slice 10 having a $P^+$ crystal body or region of .001 ohm centimeter resistivity and a surface region 12 of about 10 microns thickness of high resistivity P-type epitaxially formed germanium material. The epitaxial layer 12 will ordinarily be from 5 to 15 microns in thickness, though 10 microns is preferred in this example.

The crystal slice 10 of FIG. 1 is subjected to a diffusion of an N-type dopant such as antimony to produce a surface N-type region 13 of about 1 to 3 microns thickness into the epitaxial layer 12 as shown in FIG. 2. The slice 10 is then diced and each die is etched to remove about 15 microns of surface material at one end thus expose an area 14 of the $P^+$ material of the region 11 parallel to the surface of the epitaxial layer 12. The resulting die, shown in FIG. 3, is preferably of elongate or bar shape with at least one end portion etched away to expose the $P^+$ region. The thickness of material removed is small enough that in subsequent operations suitable bonds and connections are made as though the surface were in one plane. The die or bar 10 of FIG. 3 is thus ready for assembly with a ceramic support to be described.

In FIGS. 4 through 8, the stepwise production of a ceramic support element for use with the die of FIG. 3 is illustrated. A disc 15 of unfired bisque aluminum oxide ($AL_2O_3$) of suitable thickness is shown in FIG. 4. The unfired or bisque aluminum oxide is relatively soft and easily machined. The disc 15 as shown in FIG. 4 has been subjected to a machining operation to form a surface pattern of mesa structures, or raised portions, together with holes therethrough for subsequent lead wire insertion. Hole 16 is provided for insertion of a collector lead wire, and a raised portion 17 adjacent forms a collector conductor support. An adjacent raised portion 18 forms a base conductor support leading to a hole 19 for insertion of a base lead wire. The base conductor support 18 is of U-shaped encompassing a raised emitter conductor support 21 leading to an emitter lead wire hole 22. An additional mesa 23 is provided in line with the collector, base and emitter conductor supports to furnish physical support for the crystal die or bar 10 illustrated in FIG. 3. The adjacent portions, or arms, of the base support 18 and the emitter 21 are of such narrow dimensions that additional support area for the die is highly desirable.

The relief pattern of mesas on the disc 15, as shown in FIG. 4, is preferably formed by ultrasonic drilling with a very precise tool face which may be produced by photomasking and etching techniques. Casting techniques may be used for larger patterns. A sectional view of the disc 15 is shown in FIG. 5 with the height of the raised portions exaggerated for purposes of illustration, the mesas preferably being .005–.010 inch high, about .002 inch between and .004 inch across the arms of the raised portions. The bisque aluminum material is then fired at a suitable temperature to harden the disc material, and in the firing process the material will shrink to about 80% of its original volume. The dimensions of the original surface pattern must accordingly be about 25% larger than the final desired dimensions after firing.

The raised portions of the disc 15 are next coated with metal material 24 as shown in FIG. 6, onto which other materials may be deposited, as by the electroless or electrolytic plating processes. In the preferred case, the raised portions are coated by a bond-on technique or by burnishing with a molybdenum manganese coating 24 of metal, and the metal surfaces thereof are subsequently chemically activated so that they may be electrolessly plated in preference to the other surfaces of the disc. The disc 15 of FIG. 6 is next plated electrolessly with a copper layer 25, and the copper layer is electrolessly plated with a nickel layer 26 to produce the layer structure shown in FIG. 7. The copper may alternatively be coated by the well known roll-on technique. The layers of plating are desired because it is difficult to directly plate nickel onto the ceramic surface, and the nickel surface is preferred for subsequent plating of doping materials.

An alternate procedure will first coat the entire wafer 15 with metal, and then cut the surface pattern as by an ultrasonic cutting tool. The combination of nickel and copper layers provides an excellent bond to the molybdenum manganese surface and to known lead wire materials such as tantalum. Wires 27, 28 and 29 are placed into the holes 16, 19 and 22 and the assembly raised to bonding temperature to form a nickel copper bonding alloy on the molybdenum manganese surface, and to form a physical and electrical connection between the lead wires and the respective raised surfaces 17, 18, 21 and 23 and forming hermetic seals to close the holes. The assembly, as shown in FIG. 7 prior to the bonding step, is successively subjected to electrolytic plating of suitable dopant materials on to the respective mesas 17, 18, 21 and 24. To produce the PNP type germanium transistor of this illustration, a lead antimony layer 30 is first plated onto the raised arms 18 of the base conductor support and onto the raised arm 21 of the emitter conductor support as shown in FIG. 8. A gallium or lead gallium layer 52 is next plated only on the emitter support 21 and, if desired, on the collector support 17 as layer 51. The high doping level of the P+ region 11 of the crystal die is sufficient to form ohmic contact in subsequent bonding with the support 17 even though an N-type dopant is present on the support. It is, however, preferred to coat the support 17 with a P-type dopant layer 50, the mesa 23 is preferably coated with an N-type dopant layer 53 to match the dopant of the base portion of the crystal 10. The resulting structure shown in FIG. 8 is ready for assembly with the crystal die 10 as shown in FIG. 3.

The crystal die 10 and the ceramic support disc 15 prepared as above described are assembled with the epitaxially produced layer 12 of the die placed across the arm portions of the raised areas of the disc 15 and so aligned that the mesa of the die 10 contacts at least the arms of the emitter 21 and base 18, and the area 14 of the P+ region 11, exposed adjacent the mesa of the crystal 10, is in contact with or adjacent the collector conductor support 17. The assembly is then heated to bonding temperature in a conventional alloying and diffusion process step to produce the structure shown in FIG. 9 where the emitter strip 21 forms an emitter region 31 within the epitaxially produced layer 12, and the base strips 18 are ohmically connected to the base region 13 of the epitaxially produced layer. The diffusing step at the end of the above alloy diffusing process further diffuses N-type dopant from the emitter coductor support 21 to produce an additonal N-type region in the epitaxial layer 12 of predetermined thickness which region forms the important portion 32 of the base between the emitter region 31 and the epitaxial collector region 12. Connection between the epitaxial P-region 12 and the collector conductor support 17 is made through the area 14 of the body of the crystal 11, which is of low resistivity material as heretofore described. The bonding metals 30 easily fill the gap formed by removal of the epitaxial material to form the area 14.

FIG. 10 is a sectional view of an encapsulated transistor in a standard metal package made by the procedures above set forth; except that the perimeter surface 34 of the disc 15 was also plated with molybdenum manganese and with copper and nickel as heretofore described. The package base ring 35 shown in FIG. 10 was bonded to the disc, and after suitable etching and cleaning operations to insure quality of the PN junctions formed in prior processing, the cap 36 was sealed in place.

An alternate package which is especially suitable in microminiaturized applications is shown in FIG. 11. The processing of the disc 15 to produce a ceramic package as shown in FIG. 11 is substantially identical to that illustrated in FIG. 10 except that an additional raised ring 37 is formed on the disc 15 at the perimeter thereof and the raised ring 37 is plated in the manner heretofore described for the perimeter surface 34. An additional ceramic cap 38 is also prepared with a raised ring 39 which is metalized and plated in the same fashion as the ring 37, and in final assembly after suitable etching and cleaning of the crystal 10 and the PN junctions formed therein the cap 38 is joined with its ring 39 to the ring 37 of the disc 15 and the emitter when hermetic seal is made in the usual alloy bonding heat treating. If preferred the copper and nickel coatings may be omitted from one of the rings 37 and 39 since the materials on the other of the rings will constitute a sufficient bonding alloy.

While the foregoing illustration described the production of a PNP germanium post-alloy diffused transistor on a crystal having a low resistivity body region 11 and a high resistivity epitaxial layer 12 thereon, other devices may be produced by similar techniques. In germanium, the group V elements (phosphorus, arsenic and antimony) have generally higher diffusion coefficients than the group III elements (boron, aluminum, gallium, indium) while the group III elements have the higher distribution coefficients. It is thus advantageous to double-dope to produce a P-type emitter region, and to diffuse a more rapid diffusing N-type dopant therefrom to produce a base region of controlled thickness.

In silicon, the group III elements have higher diffusion coefficients and the group V elements have the higher distribution coefficients, so this type process is used, with post-alloy diffusion, to produce NPN silicon structures. The same type of process may be applied to many of the III–V compound semiconductor materials, gallium arsenide for example paralleling silicon in that it is generally used to produce NPN structures.

When epitaxial material is not used, more conventional doping procedures may be used to fabricate devices. For example, as shown in FIG. 12, a P-type germanium crystal 41 is surface-diffused with antimony to produce an N-type surface crystal region 42, and a back strap 45 is ohmically bonded thereto. A double-doped emitter forming alloy is alloyed to the N-type surface to produce a P-type emitter region 43 and then the N-type dopant therein is diffused to establish an N-type base region in peripheral connection to the original N-diffused surface region. A second, N-type alloy, is then bonded to produce an ohmic base contact to the N-type surface region. By placing the emitter and base contact alloys on ceramic supports 44 as heretofore explained for wafer 15, and bonding the back strap 43 to the ceramic, a transistor structure shown in FIG. 12 may be produced.

Transistors of high power capacity are easily made by the above techniques, with or without the refinement of post-alloy diffusion to produce the base region. The transistor of FIG. 12 is illustrated with a thin N-type region 42 designed to electrically connect the base contact to the base region adjacent the emitter, and in the bonding process the N-type region is extended adjacent both the emitter and base lead areas. An alternate construction may be produced without the post-alloy diffusion step in which the emitter is formed within the boundaries of the original N-type region. In such a case, the dopant material used on the emitter lead area of the ceramic need only be of P-type.

Diodes may be produced by doping a bonding alloy with a type opposite to the crystal type to be used, so that the subsequent bonding step produces a PN junction adjacent the bond in the crystal. This would ordinarily be a regrown region, such as P-type in an originally N-type crystal. The second, or ohmic, contact may be made to the same crystal face or to a back surface as illustrated by the collector contact of FIG. 12.

Having described our invention, we claim:

1. A method of making a semiconductor device, which comprises:

preparing a ceramic element having an area coated with electrically conductive material comprising on at least a portion of said area a bonding alloy and a semiconductor conductivity type dopant, by a process comprising doping a first electrically conductive metal layer on the area to bond to the ceramic, and depositing a second electrically conductive metal layer comprising a bonding alloy and electrical conductivity type dopant on at least a portion of the first layer;

assembling a semiconductor die and the ceramic element with said coated area portion in contact with said die; and heat treating said assembly to bond the die to the element and produce an electrical connection between the die and the electrically conductive material.

2. A method of making a semiconductor device, which comprises:

preparing a ceramic element having an area coated with electrically conductive material comprising on at least a portion of said area a bonding alloy and a first conductivity type dopant;

preparing a semiconductor die having a surface-adjacent region therein of second conductivity type;

assembling the die and the ceramic element with said coated area portion in contact with said region; and heat treating said assembly to bond the die to the element and produce a PN junction in said region.

3. A method according to claim 2 wherein the die is prepared with a surface-adjacent layer of higher electrical resistivity in said region and a main body of low resistivity.

4. A method according to claim 3 wherein the die is prepared with a second surface-adjacent layer of second conductivity type within the first layer.

5. A method according to claim 2 wherein the material on the area portion also comprises second type dopant of higher diffusion coefficient than that of the first type dopant, and the heat treating step diffuses the second type dopant ahead of the first type dopant into the die to establish in the die a region of first type conductivity adjacent the ceramic material and a surrounding region of second conductivity type.

6. A method according to claim 2 wherein:

the ceramic elements is prepared with a second area coated with electrically conductive material comprising on at least a portion thereof a bonding alloy;

and the assembly step contacts the second area to the crystal whereby a second electrically conductive bond is made to the crystal in the heat treating step.

7. A method according to claim 6 wherein the material coating on said portion of the second area of the ceramic element comprises a dopant material of said second type whereby an ohmic contact is made with the die in the heat treating step.

8. A method according to claim 6 wherein said area portions are raised from adjacent portions of the ceramic element.

9. A method for making a semiconductor device which comprises:

forming on a semiconductor die of relatively low resistivity a layer of relatively high resistivity of the same conductivity type;

forming within the said layer a surface-adjacent zone of opposite conductivity type;

forming a ceramic element having at least three areas coated with electrically conductive material;

coating at least a portion of the first area with a material comprising a first type dopant material and a bonding alloy;

coating at least a portion of a second of said areas with a material comprising a bonding alloy and a second type dopant material;

and coating a third of said areas with a material comprising a bonding alloy and dopant materials of both first and second types, one of which will diffuse more rapidly into said semiconductor die material than the other;

assembling said die with said surface-adjacent zone adjacent said three areas;

and heating said assembly to bond said die to said areas and to form electrical contacts between said die and said areas and to form adjacent said third area an emitter region in said die bounded by a base region of opposite conductivity type in the die.

10. A method according to claim 8 wherein a portion of the high resistivity layer is removed from the surface of the said die to expose the lower resistivity bulk die material prior to said assembly;

and upon assembly the portion of the die wherein said layer was removed is positioned adjacent the area having in its coating only the dopant material of the type corresponding to the faster diffusing material on the third area.

11. The process according to claim 9 wherein said semiconductor dies is of germanium material of P-type;

and the dopant materials on the respective areas are gallium, antimony, and both gallium and antimony.

12. The method according to claim 8 wherein the die is of N-type gallium-arsenide compound semiconductor material.

13. The method according to claim 8 wherein the die is N-type silicon material, and the dopant materials on said areas are antimony, gallium, and both gallium and antimony.

14. A method of making a semiconductor device, which comprises: preparing a ceramic element having an area coated with electrically conductive material and on at least a portion thereof a layer of bonding alloy and a first conductivity type dopant; preparing a semiconductor die having a surface adjacent region therein of second conductivity type; assembling the die and the ceramic element with said layer in contact with said region; and heat treating said assembly to bond the element to said region of the die to simultaneously form by diffusion a rectifying junction.

References Cited by the Examiner

UNITED STATES PATENTS

| | | | |
|---|---|---|---|
| 2,804,581 | 8/1957 | Lichtgarn | 317—235 |
| 2,866,878 | 12/1958 | Briggs et al. | 338—15 X |
| 2,945,286 | 7/1960 | Dorendorf | 29—25.3 |
| 2,946,114 | 7/1960 | Berg | 29—25.3 |

| | | | |
|---|---|---|---|
| 2,953,729 | 9/1960 | Manintveld et al. | 317—235 |
| 2,959,719 | 11/1960 | Ezaki | 317—235 |
| 3,025,439 | 3/1962 | Anderson. | |
| 3,031,747 | 5/1962 | Green | 29—504 X |

JOHN F. CAMPBELL, *Primary Examiner.*

GEORGE N. WESTBY, WHITMORE A. WILTZ, *Examiners.*

L. ZALMAN, P. M. COHEN, *Assistant Examiners.*